United States Patent
Zhou et al.

(10) Patent No.: US 9,634,019 B1
(45) Date of Patent: Apr. 25, 2017

(54) NON-VOLATILE SPLIT GATE MEMORY CELLS WITH INTEGRATED HIGH K METAL GATE, AND METHOD OF MAKING SAME

(71) Applicant: Silicon Storage Technology, Inc., San Jose, CA (US)

(72) Inventors: Feng Zhou, Fremont, CA (US); Xian Liu, Sunnyvale, CA (US); Jeng-Wei Yang, Zhubei (TW); Chien-Sheng Su, Saratoga, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/225,393

(22) Filed: Aug. 1, 2016

Related U.S. Application Data

(60) Provisional application No. 62/236,101, filed on Oct. 1, 2015.

(51) Int. Cl.

| | |
|---|---|
| *H01L 21/28* | (2006.01) |
| *H01L 21/336* | (2006.01) |
| *H01L 29/66* | (2006.01) |
| *H01L 27/115* | (2006.01) |
| *H01L 27/11521* | (2017.01) |

(Continued)

(52) U.S. Cl.
CPC .. *H01L 27/11521* (2013.01); *H01L 21/28273* (2013.01); *H01L 21/8238* (2013.01); *H01L 29/42328* (2013.01); *H01L 29/42332* (2013.01); *H01L 29/4916* (2013.01); *H01L 29/66825* (2013.01); *H01L 29/7883* (2013.01)

(58) Field of Classification Search
CPC .......... H01L 27/11521; H01L 29/7883; H01L 29/4816; H01L 29/42383; H01L 29/42332; H01L 29/66825; H01L 21/8238; H01L 21/28273
See application file for complete search history.

(56) References Cited

U.S. PATENT DOCUMENTS

| | | |
|---|---|---|
| 5,242,848 A | 9/1993 | Yeh |
| 6,747,310 B2 | 6/2004 | Fan et al. |

(Continued)

OTHER PUBLICATIONS

U.S. Appl. No. 15/180,376, filed Jun. 2016, Su et al.

*Primary Examiner* — Savitr Mulpuri
(74) *Attorney, Agent, or Firm* — DLA Piper LLP (US)

(57) ABSTRACT

A method of forming a pair of memory cells that includes forming a polysilicon layer over and insulated from a semiconductor substrate, forming a pair of conductive control gates over and insulated from the polysilicon layer, forming first and second insulation layers extending along inner and outer side surfaces of the control gates, removing portions of the polysilicon layer adjacent the outer side surfaces of the control gates, forming an HKMG layer on the structure and removing portions thereof between the control gates, removing a portion of the polysilicon layer adjacent the inner side surfaces of the control gates, forming a source region in the substrate adjacent the inner side surfaces of the control gates, forming a conductive erase gate over and insulated from the source region, forming conductive word line gates laterally adjacent to the control gates, and forming drain regions in the substrate adjacent the word line gates.

8 Claims, 17 Drawing Sheets

(51) Int. Cl.
*H01L 29/788* (2006.01)
*H01L 29/49* (2006.01)
*H01L 29/423* (2006.01)
*H01L 21/8238* (2006.01)

(56) References Cited

U.S. PATENT DOCUMENTS

| | | | |
|---|---|---|---|
| 7,119,396 B2 * | 10/2006 | Chen | H01L 21/28114 |
| | | | 257/324 |
| 7,326,614 B2 * | 2/2008 | Kianian | H01L 21/28273 |
| | | | 257/E21.209 |
| 7,868,375 B2 | 1/2011 | Liu et al. | |
| 7,927,994 B1 | 4/2011 | Liu et al. | |
| 8,101,477 B1 | 1/2012 | Power | |
| 9,276,006 B1 | 3/2016 | Chen et al. | |
| 9,349,741 B2 * | 5/2016 | Liu | H01L 27/11524 |
| 9,379,121 B1 | 6/2016 | Chen et al. | |
| 9,431,257 B2 * | 8/2016 | Liu | H01L 27/1157 |
| 9,484,261 B2 * | 11/2016 | Su | H01L 21/823425 |
| 9,496,369 B2 * | 11/2016 | Wu | H01L 29/42328 |
| 2009/0166708 A1 | 7/2009 | Io | |
| 2010/0207174 A1 * | 8/2010 | Tsai | H01L 29/808 |
| | | | 257/272 |
| 2013/0207174 A1 | 8/2013 | Wang | |
| 2014/0097482 A1 | 4/2014 | Tokunaga et al. | |
| 2016/0086962 A1 * | 3/2016 | Su | H01L 27/11531 |
| | | | 438/157 |
| 2016/0218110 A1 * | 7/2016 | Yang | H01L 21/30604 |

\* cited by examiner

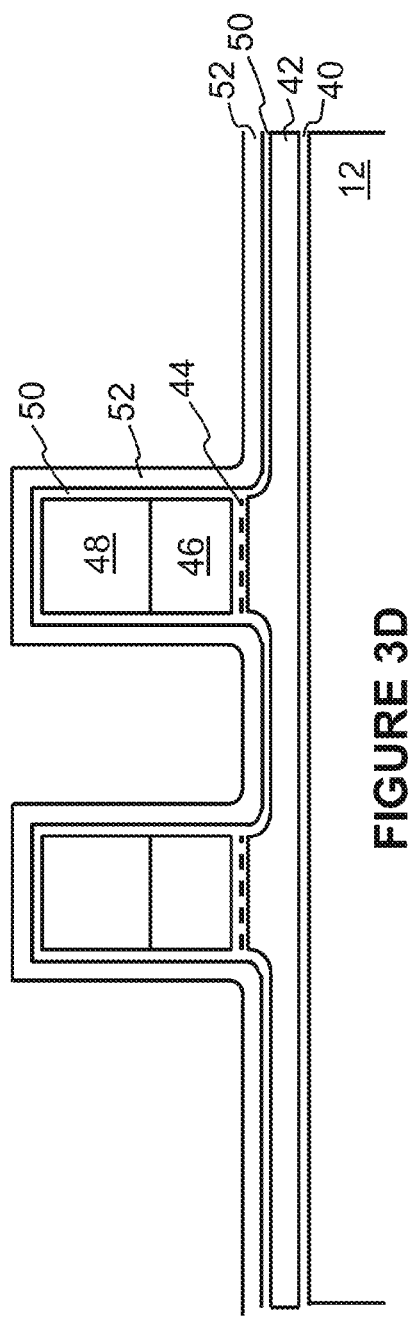
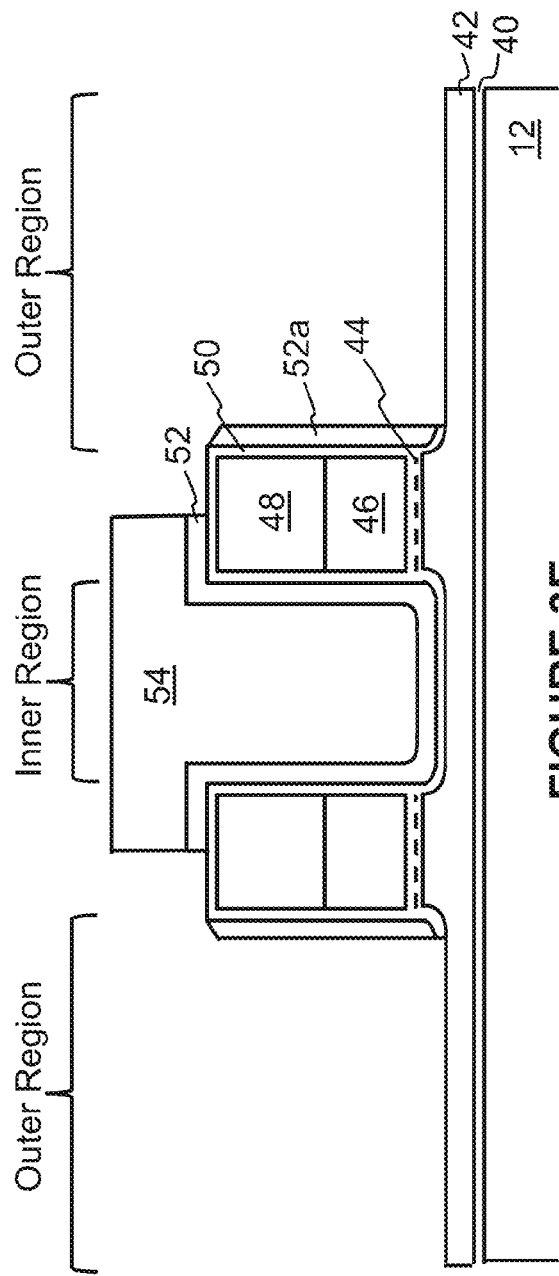
FIGURE 3D
FIGURE 3E

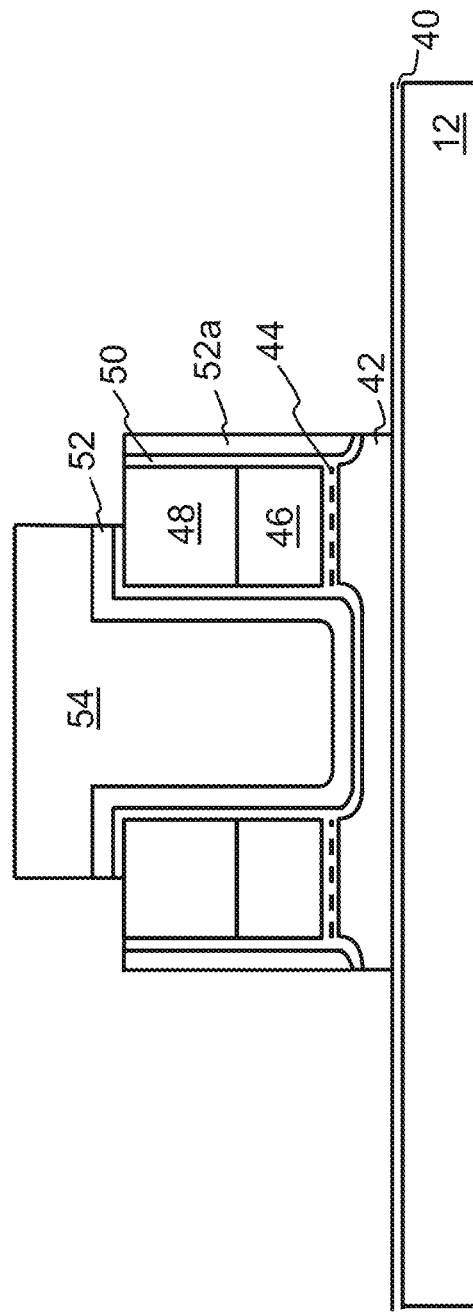
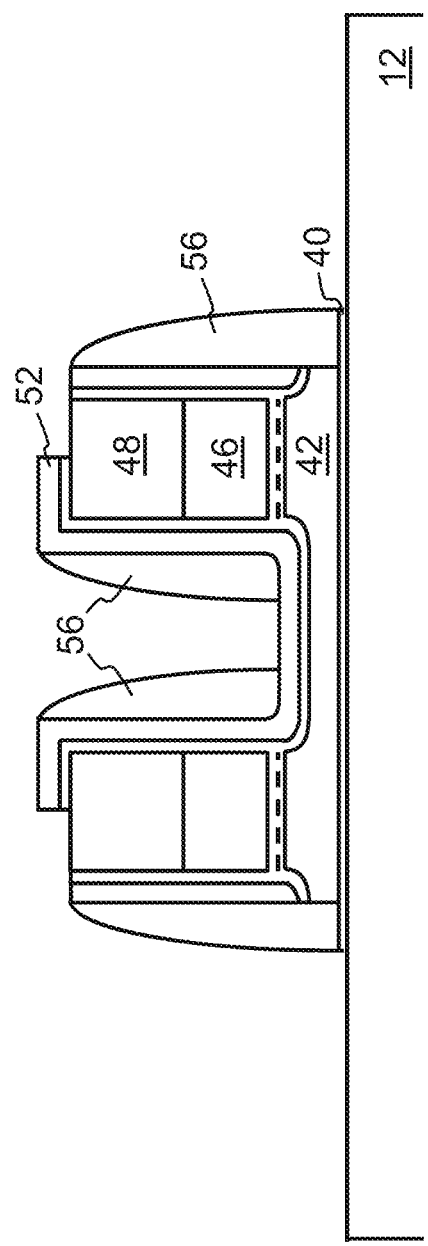
FIGURE 3F
FIGURE 3G

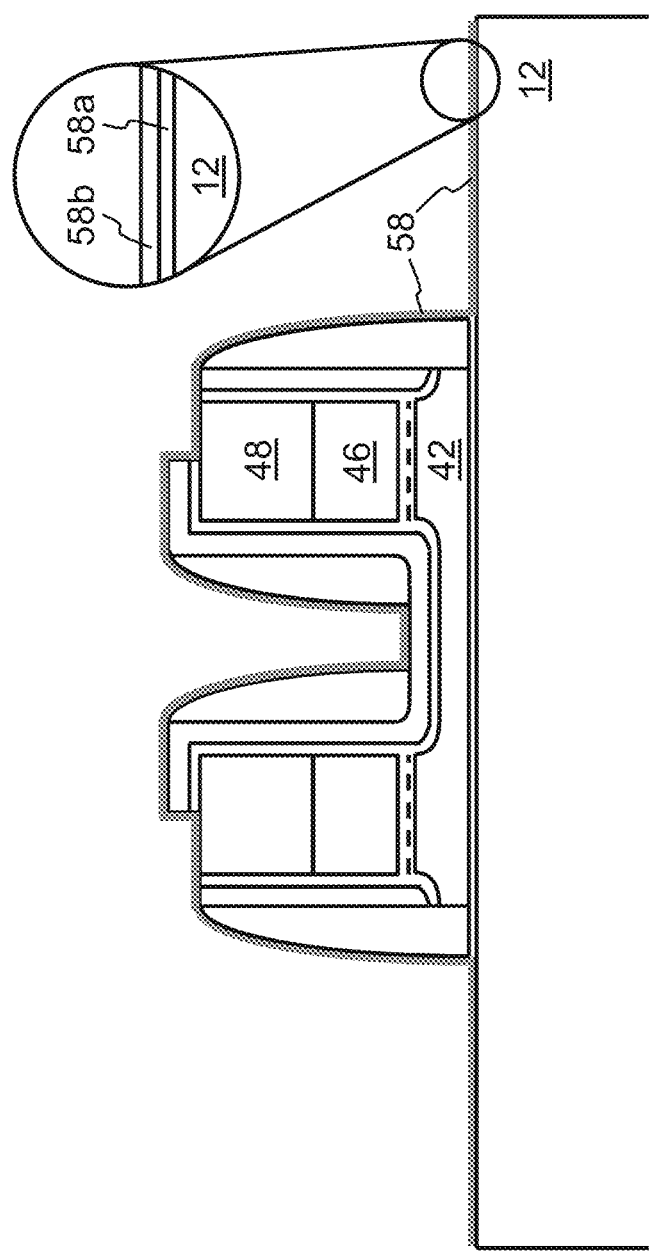

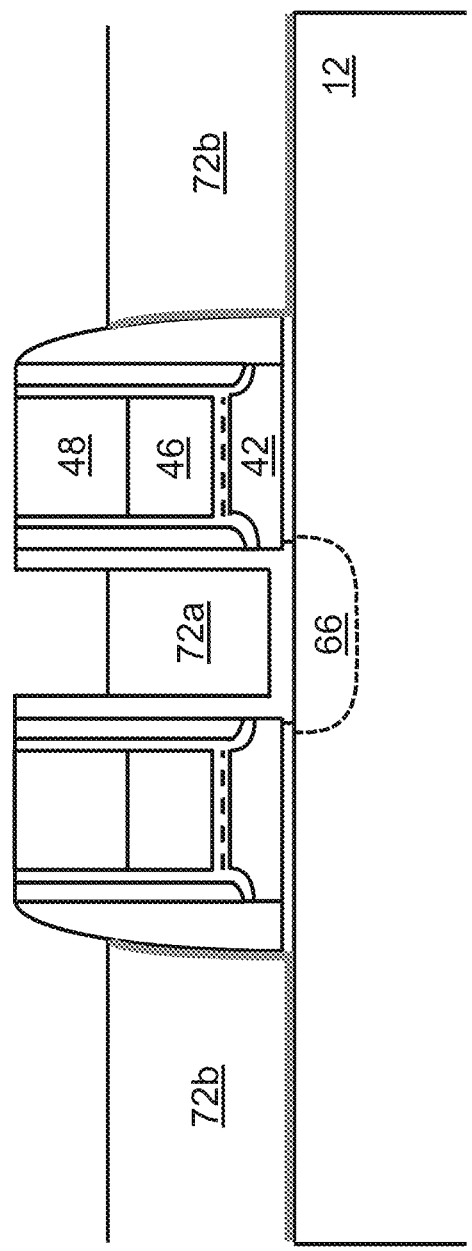

US 9,634,019 B1

NON-VOLATILE SPLIT GATE MEMORY CELLS WITH INTEGRATED HIGH K METAL GATE, AND METHOD OF MAKING SAME

RELATED APPLICATIONS

This application claims the benefit of U.S. Provisional Application No. 62/236,101 filed Oct. 1, 2015, and which is incorporated herein by reference.

FIELD OF THE INVENTION

The present invention relates to non-volatile memory devices.

BACKGROUND OF THE INVENTION

Split gate non-volatile memory devices are well known in the art. For example, U.S. Pat. No. 7,927,994 (which is incorporated herein by reference for all purposes) discloses a split gate non-volatile memory cell. FIG. 1 illustrates an example of such a split gate memory cell formed on a semiconductor substrate 12. Source and drain regions 16 and 14 are formed as diffusion regions in substrate 12, and define a channel region 18 therebetween. The memory cell includes four conductive gates: a floating gate 22 disposed over and insulated from a first portion of the channel region 18 and a portion of the source region 16, a control gate 26 disposed over and insulated from the floating gate 22, an erase gate 24 disposed over and insulated from the source region 16, and a select gate 20 disposed over and insulated from a second portion of the channel region 18. A conductive contact 10 can be formed to electrically connect to the drain region 14.

The memory cells are arranged in an array, with columns of such memory cells separated by columns of isolation regions. Isolation regions are portions of the substrate in which insulation material is formed. Logic (core) devices and high voltage devices can be formed on the same chip as the memory array, often formed sharing some of the same processing steps. It is also known to make the memory cell gates and the gates of the logic and high voltage gates of a high K metal material (HKMG—high K dielectric underneath metal layer). However, it has been discovered that during logic device processing, the stacks of memory cell structure can be degraded.

The present invention is a technique for forming a split gate non-volatile memory device on the same chip as logic and high voltage devices with less memory cell structure degradation.

BRIEF SUMMARY OF THE INVENTION

The aforementioned problems and needs are addressed by a method of forming a pair of memory cells that includes:
forming a polysilicon layer over and insulated from a semiconductor substrate;
forming a pair of spaced apart conductive control gates over and insulated from the polysilicon layer, wherein the control gates having inner side surfaces facing each other and outer side surfaces facing away from each other;
forming a first insulation layer that extends directly along the inner and outer side surfaces of the control gates;
forming a second insulation layer that extends directly along the first insulation layer;
removing portions of the polysilicon layer adjacent the outer side surfaces of the control gates;
forming first insulation spacers that extend directly along the second insulation layer and indirectly along the outer side surfaces of the control gates;
forming second insulation spacers that extend directly along the second insulation and indirectly along the inner side surfaces of the control gates;
forming an HKMG layer extending along the first and second insulation spacers and along portions of the substrate adjacent the outer side surfaces of the control gates, wherein the HKMG layer includes:
  a layer of high K insulation material, and
  a layer of metal material on the layer of high K insulation material;
removing portions of the HKMG layer extending along the second insulation spacers;
removing the second insulation spacers;
removing a portion of the polysilicon layer adjacent the inner side surfaces of the control gates;
forming a source region in the substrate adjacent the inner side surfaces of the control gates;
forming a conductive erase gate over and insulated from the source region, wherein the erase gate is insulated from each of the control gates by at least the first insulation layer and the second insulation layer;
forming conductive word line gates laterally adjacent to the first insulation spacers, wherein for each of the word line gates, the HKMG layer includes a first portion disposed between the word line gate and one of the first insulation spacers and a second portion disposed between the word line gate and the substrate; and forming drain regions in the substrate each disposed adjacent to one of the word line gates.

Other objects and features of the present invention will become apparent by a review of the specification, claims and appended figures.

DETAILED DESCRIPTION OF THE INVENTION

The present invention solves the above mentioned problems by protecting the memory cell structure during the formation and processing of logic devices formed on the same chip. The method of forming such a memory cell is illustrated in FIGS. 2A to 2F, 3A to 3R. The method begins with a semiconductor substrate 12, which is preferably of P type and is well known in the art.

Isolation Region Formation

Figure 1:
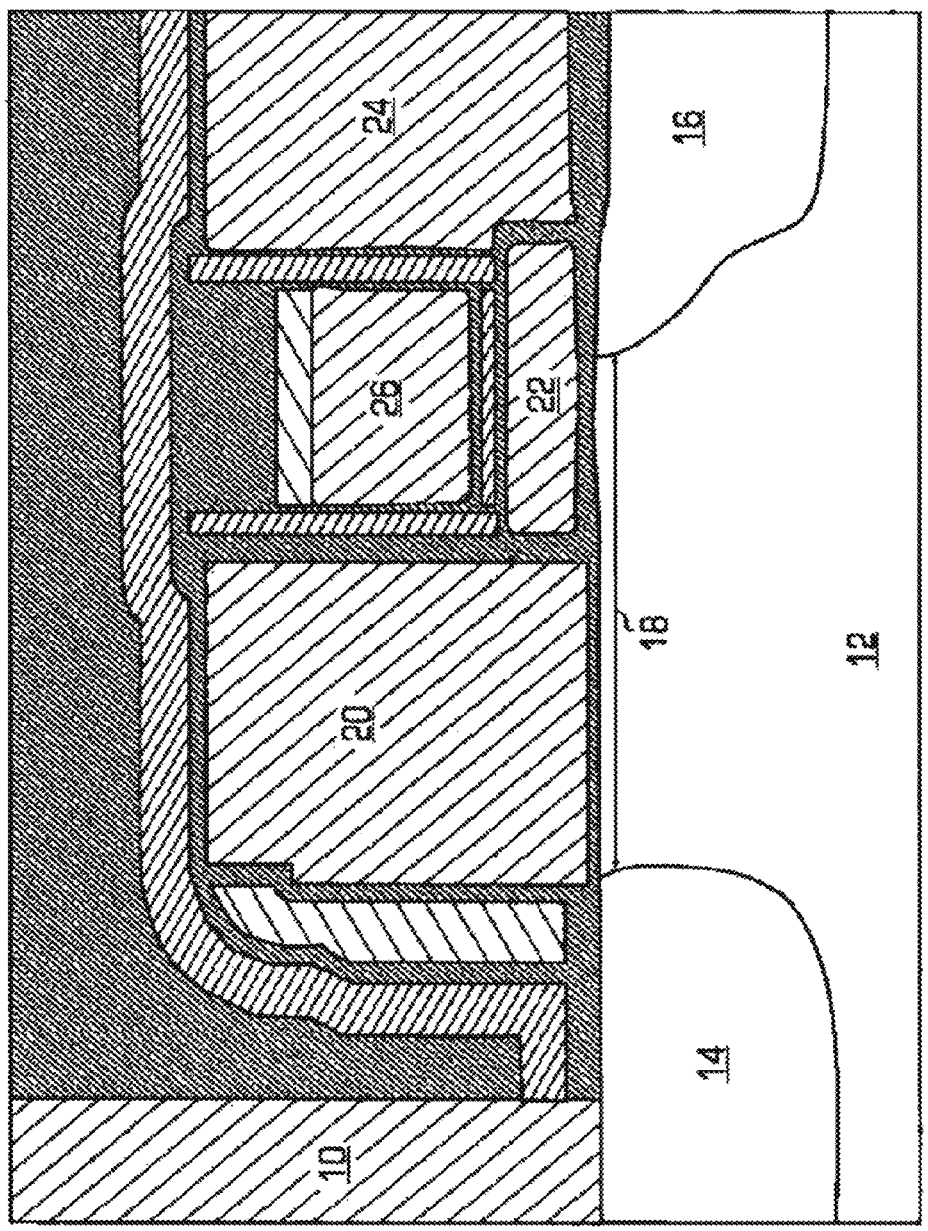
FIG. 1 is a side cross sectional view of a conventional non-volatile memory cell.
Figure 2A:
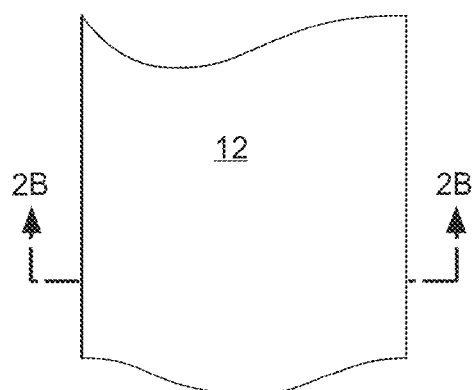
FIGS. 2A and 2C are top views of a semiconductor substrate.
Figure 2B:
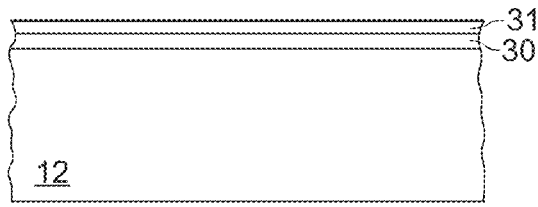
FIGS. 2B and 2D-2F are side cross sectional views illustrating the steps in forming active and isolation regions in the semiconductor substrate.

FIGS. 2A to 2F illustrate the well-known STI method of forming isolation regions on a substrate. Referring to FIG. 2A there is shown a top plan view of a semiconductor substrate 12 (or a semiconductor well), which is preferably of P type and is well known in the art. First and second layers of material 30 and 31 are formed (e.g. grown or deposited) on the substrate. For example, first layer 30 can be silicon dioxide (hereinafter "oxide"), which is formed on the substrate 12 by any well known technique such as oxidation or oxide deposition (e.g. chemical vapor deposition or CVD). Nitrogen doped oxide or other insulation dielectrics can also be used. Second layer 31 can be silicon nitride (hereinafter "nitride"), which is formed over oxide layer 30 preferably by CVD or PECVD (Plasma Enhanced CVD). FIG. 2B illustrates a cross-section of the resulting structure.

Figure 2D:
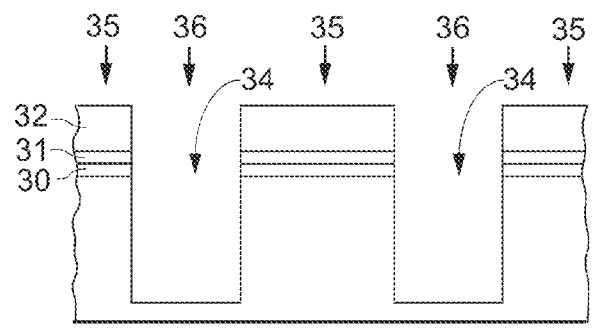
Figure 2C:
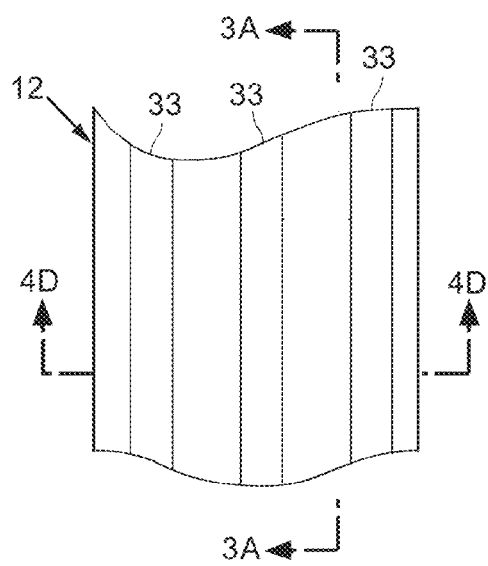

Once the first and second layers 30/31 have been formed, suitable photo resist material 32 is applied on the nitride layer 31 and a masking step is performed to selectively remove the photo resist material from certain regions (stripes 33) that extend in the Y or column direction, as shown in FIG. 2C. Where the photo-resist material 32 is removed, the exposed nitride layer 31 and oxide layer 30 are etched away in stripes 33 using standard etching techniques (i.e. anisotropic nitride and oxide/dielectric etch processes) to form trenches 34 in the structure. A silicon etch process is then used to extend trenches 34 down into the silicon substrate 12, as shown in FIG. 2D. Where the photo resist 32 is not removed, the nitride layer 31 and oxide layer 30 are maintained. The resulting structure illustrated in FIG. 2D now defines active regions 35 interlaced with isolation regions 36.

Figure 2E:
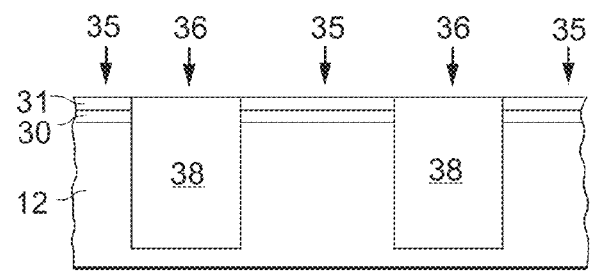

The structure is further processed to remove the remaining photo resist 32. Then, an isolation material such as silicon dioxide is formed in trenches 34 by depositing a thick oxide layer, followed by a Chemical-Mechanical-Polishing or CMP etch (using nitride layer 31 as an etch stop) to remove the oxide layer except for oxide blocks 38 in trenches 34, as shown in FIG. 2E. The remaining nitride and oxide layers 31/30 are then removed using nitride/oxide etch processes, leaving STI oxide blocks 38 extending along isolation regions 36, as shown in FIG. 2F.

FIGS. 2A to 2F illustrate the memory cell array region of the substrate, in which columns of memory cells will be formed in the active regions 35 which are separated by the isolation regions 36. It should be noted that the substrate 12 also includes at least one periphery region in which control circuitry is formed that will be used to operate the memory cells formed in the memory cell array region. Preferably, isolation blocks 38 are also formed in the periphery region during the same STI process described above.

Memory Cell Formation

Figure 2F:
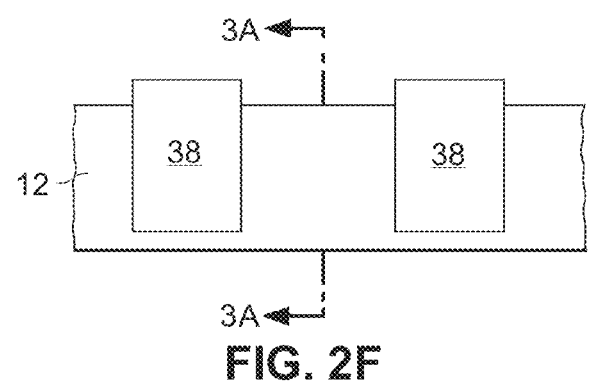
Figure 3A:
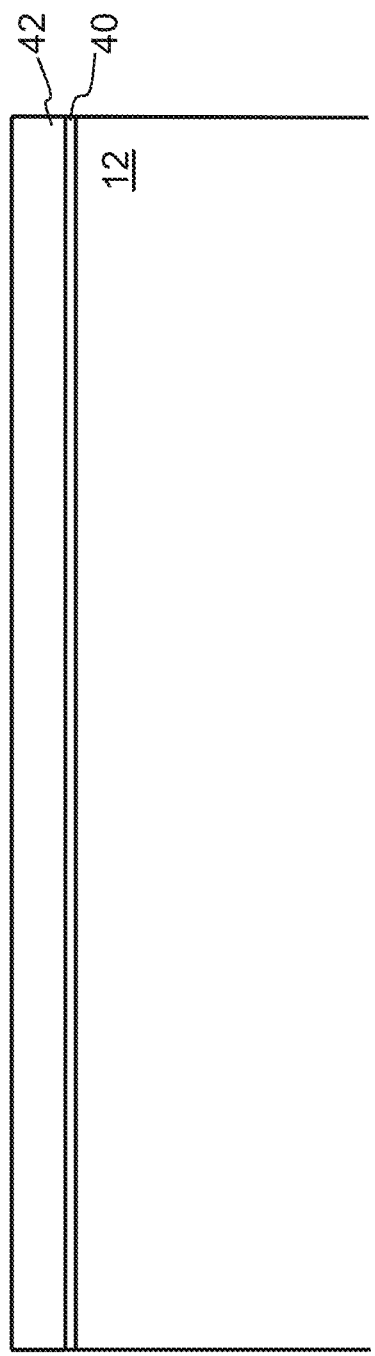
FIGS. 3A-3R are side cross sectional views illustrating the steps in forming non-volatile memory cells.

The structure shown in FIG. 2F is further processed as follows. FIGS. 3A to 3R show the cross sections of the structure in the active regions 35 from a view orthogonal to that of FIG. 2F (along line 3A-3A as shown in FIGS. 2C and 2F), as the next steps in the process of the present invention are performed.

Commencing with FIG. 3A, there is shown the formation of a layer of silicon dioxide 40 on the substrate 12. Thereafter, a first layer 42 of polysilicon (or amorphous silicon) is deposited or formed on the layer 40 of silicon dioxide. The first layer 42 of polysilicon is subsequently patterned in a direction parallel to the active region 35 (to remove the polysilicon from the isolation regions 36).

Figure 3B:
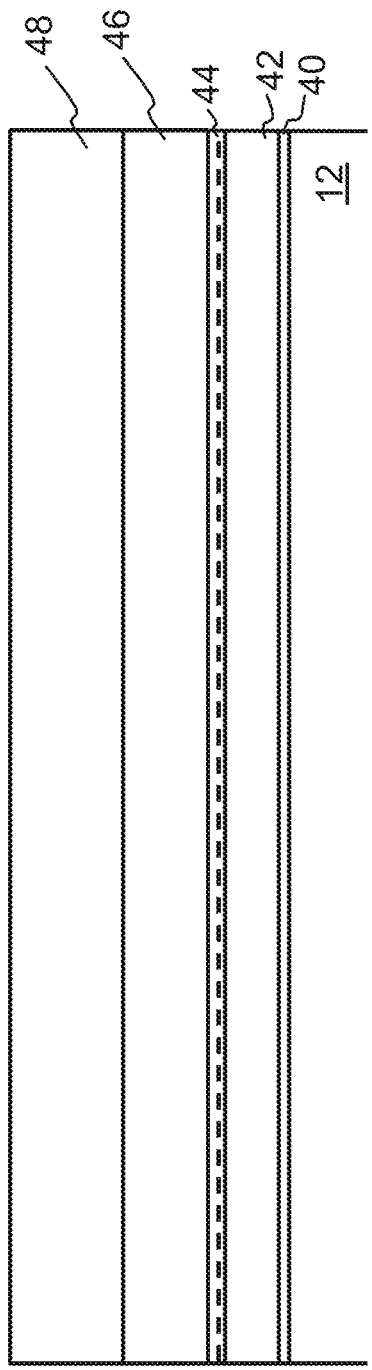

Referring to FIG. 3B, another insulating layer 44, such as silicon dioxide (or even a composite insulation layer, such as ONO—oxide, nitride, oxide sublayers) is deposited or formed on the first layer 42 of polysilicon. A second layer 46 of polysilicon is then deposited or formed on the layer 44. Another layer 48 of insulator is deposited or formed on the second layer 46 of polysilicon and used as a hard mask during subsequent dry etching. In the preferred embodiment, the layer 48 is a composite layer, comprising silicon nitride, silicon dioxide, and silicon nitride. However, layer 48 could instead be a single layer of nitride.

Figure 3C:
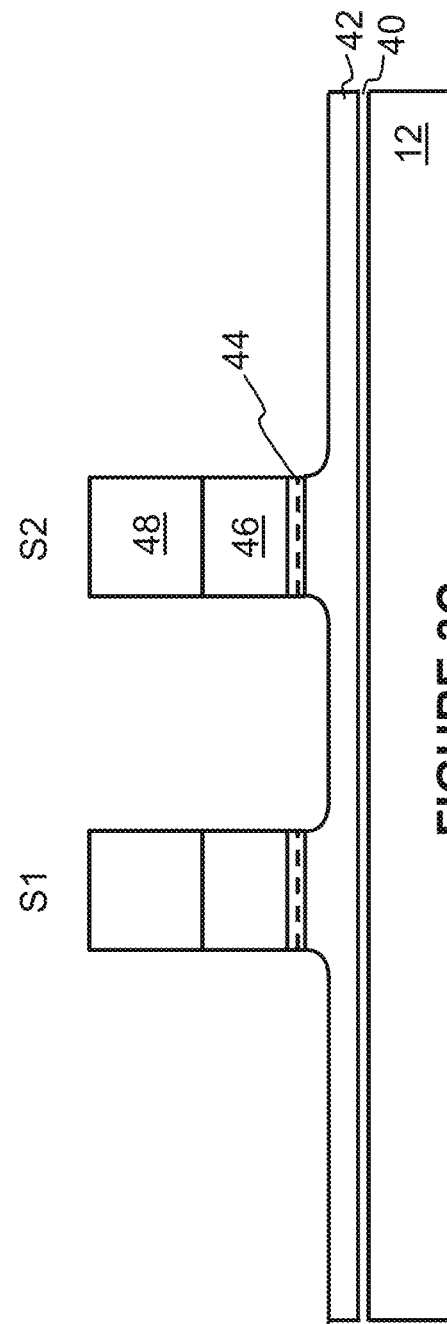

Referring to FIG. 3C, photoresist material (not shown) is deposited on the structure shown in FIG. 3B, and a masking step is formed exposing selected portions of the photoresist material. The photoresist is developed and using the photoresist as a mask, the structure is etched. The composite layer 48, the second layer 46 of polysilicon, and the composite insulating layer 44 are then anisotropically etched, until the first layer 42 of polysilicon is exposed. A poly etch can be used to remove a top portion of poly layer 42, with the upper surface thereof sloping up at each stack S1 and S2. The resultant structure is shown in FIG. 3C. Although only two "stacks" S1 and S2 are shown, it should be clear that there are number of such "stacks" that are separated from one another.

The structure is then covered with insulation layers, preferably silicon oxide (HTO) 50 and silicon nitride 52 (i.e., different insulation materials for better device isolation and protection as set forth below), as shown in FIG. 3D. An optional SiGe process module can be performed at this time, in which a channel SiGe may be formed on the PMOS device to enhance its mobility, and therefore, drive current. The process would include the deposition of a thin layer of nitride. A masking and etch process can then be used to open and remove the nitride and remaining oxide in PMOS area. SiGe can then be selectively grown on the PMOS silicon. The nitride is then removed from the non-PMOS areas.

Referring to FIG. 3E, a photolithography masking step is then performed to form photo resist 54 partially covering stacks S1 and S2 and the region between stacks S1/S2. For the purpose of this discussion, the region between the stacks S1 and S2 will be called the "inner region," and the regions on the other sides of the stacks not covered by the photoresist shall be referred to as the "outer regions," for each pair of stacks S1 and S2. A nitride etch is then performed to form spacers 52a of the nitride 52 covering sides of stacks S1/S2 in the outer regions.

A poly etch is then performed to remove exposed portions of the poly layer 42 in the outer regions not protected by the nitride spacers 52, as shown in FIG. 3F. The poly silicon 42 in the logic device areas will also be removed. The photo resist 54 is then removed. An oxide deposition (e.g. HTO) and anisotropic etch is performed to form oxide spacers 56 along nitride spacers 52a in the outer regions, and along the nitride layer 52 in the inner regions, as shown in FIG. 3G. The oxide etch removes the exposed portions of the oxide layer 40 on the substrate as well in the outer regions.

Figure 3I:
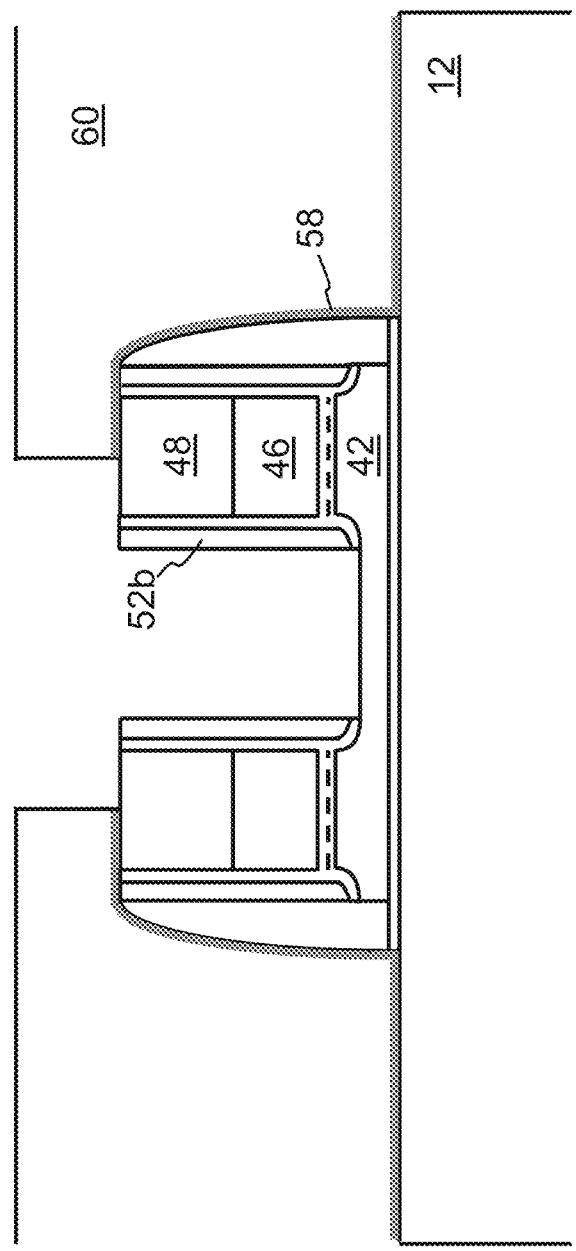
Figure 3J:
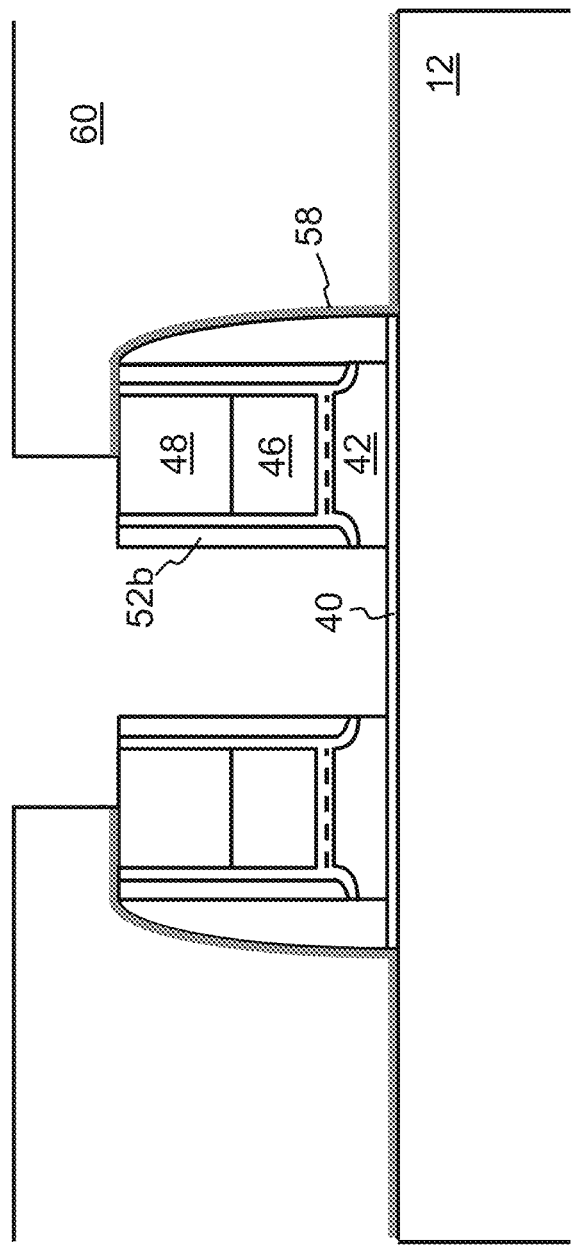

Referring to FIG. 3H, a high K metal gate layer HKMG 58 is then formed over the structure, which comprises an insulation layer 58a of a high K material (i.e. having a dielectric constant K greater than that of oxide, such as HfO2, ZrO2, TiO2, Ta2O5, or other adequate materials, etc.), underneath a conductive metal layer 58b. This formation can be done using an atomic layer chemical vapor deposition. The high K metal gate layer will also be formed in logic device areas. A masking step is then performed to cover the outer regions with photoresist 60, but the leaving the inner regions exposed. Then, an HKMG etch is performed to remove the exposed portions of HKMG layer 58 from the inner regions. An oxide etch is then used to remove the oxide spacers 56 from the inner regions. Then, a nitride etch is performed to remove remaining portions of the nitride layer 52 except for spacers 52b thereof covering sides of stacks S1/S2 in the inner region, as shown in FIG. 3I. A poly etch is then performed to remove the exposed portions of the poly layer 42 in the inner regions (which are not protected by nitride spacers 52b) exposing oxide layer 40, as shown in FIG. 3J.

Figure 3K:
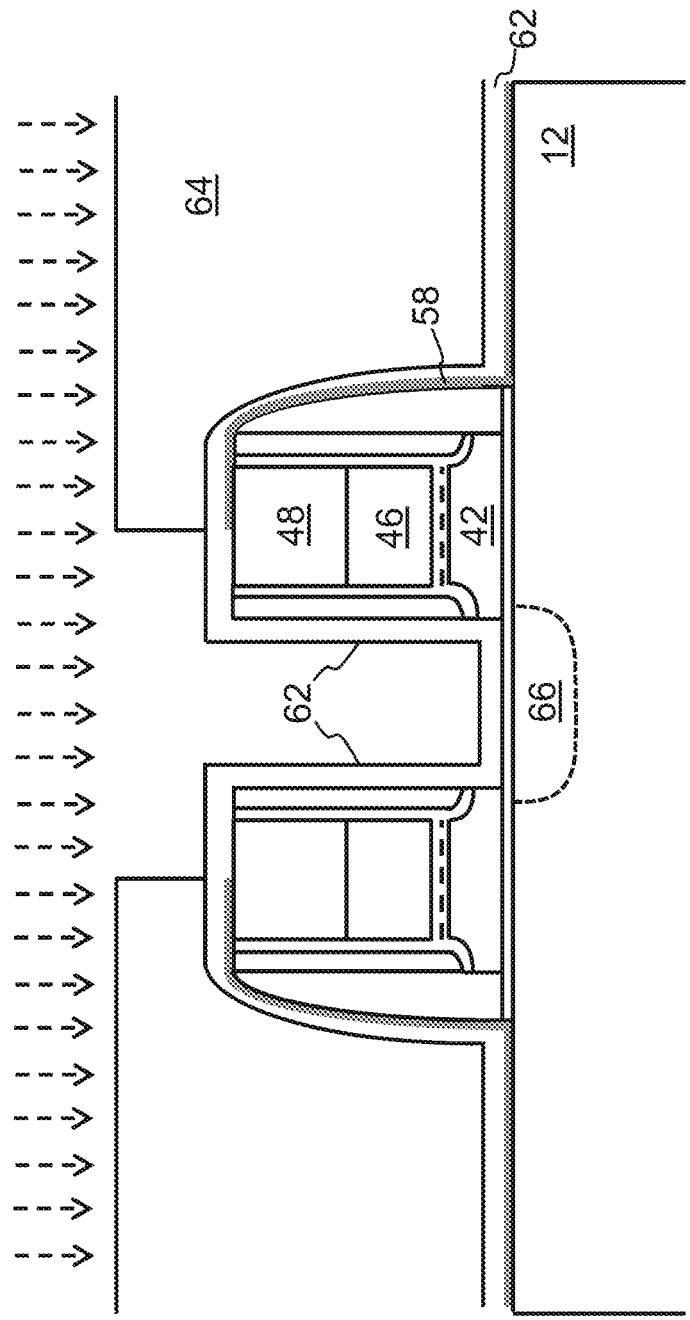
Figure 3L:
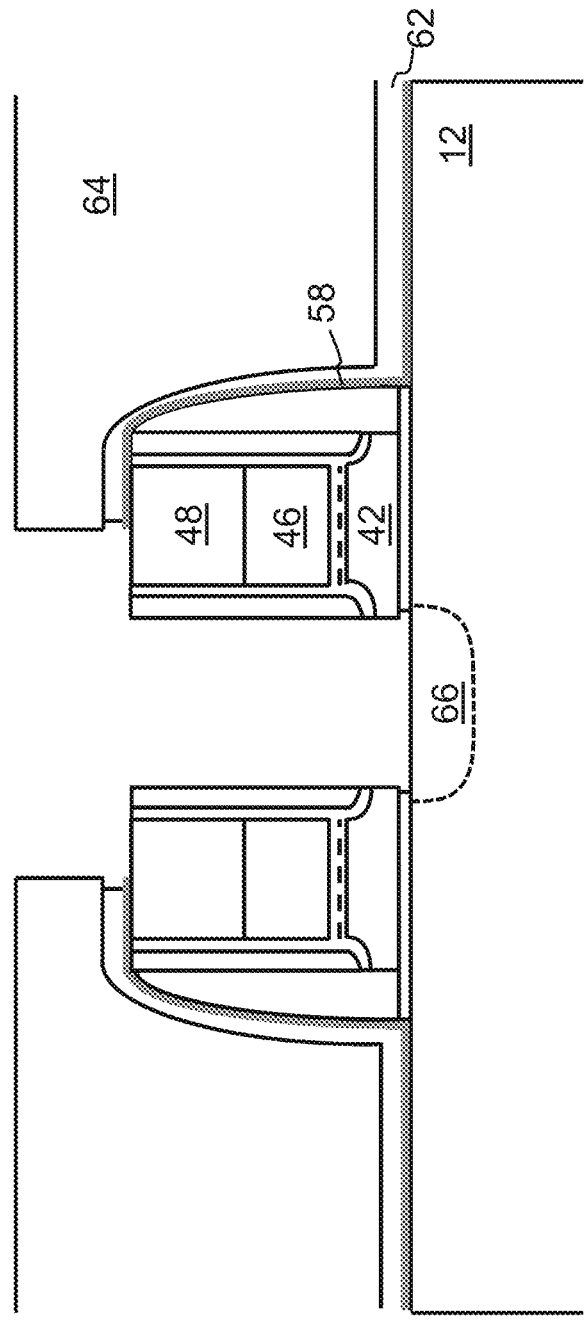
Figure 3M:
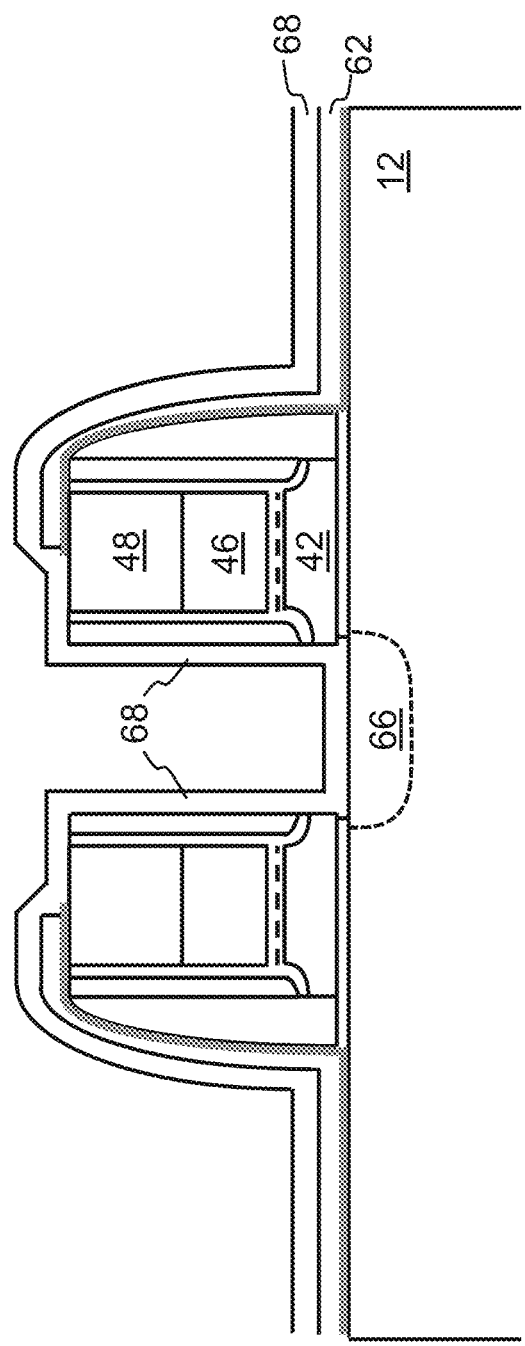
Figure 3N:
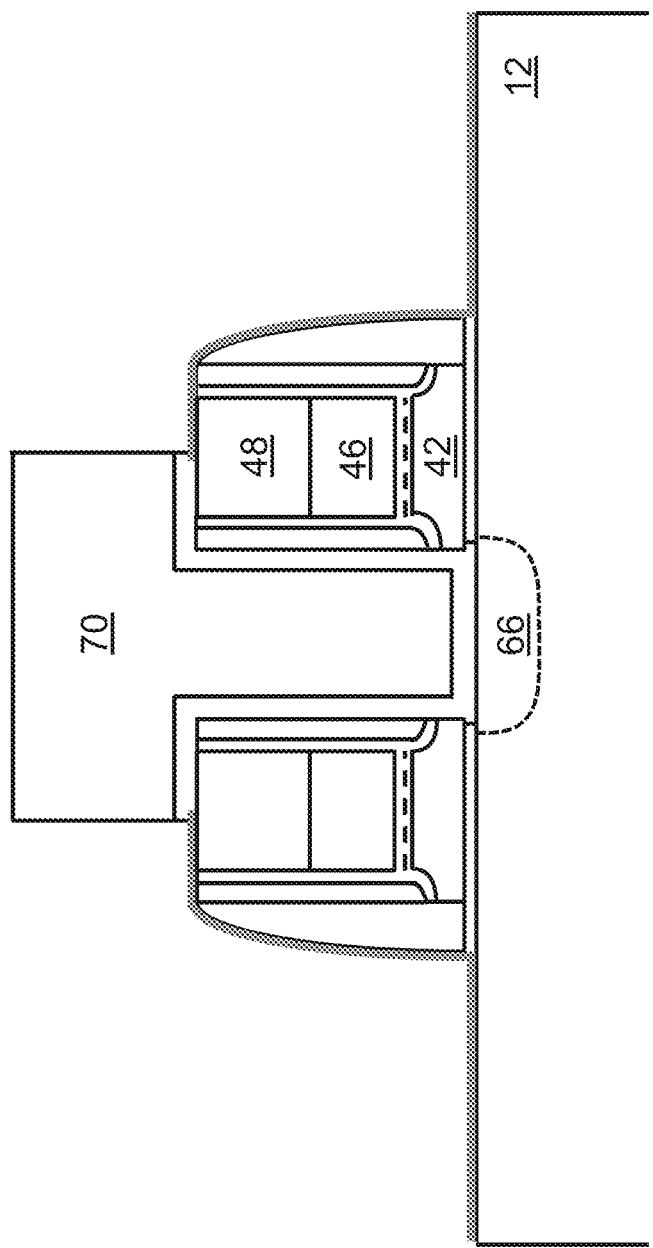

After the photo resist 60 is removed, an HV HTO oxide layer 62 is formed over the structure, which will serve as a screen oxide for subsequent implantation. Photo resist 64 is then formed over the structure, except for the inner regions. An implantation process is then performed to form source region (source line region) 66 in the substrate under the inner regions, as shown in FIG. 3K. An oxide etch is then used to remove the HV HTO oxide 62 in the inner regions, as shown in FIG. 3L. After the photo resist 64 is removed, an HTO oxide deposition is then performed to form a tunnel oxide layer 68 over the structure, as shown in FIG. 3M. Photo resist 70 is then formed over the inner regions, leaving the outer regions exposed. An oxide etch is used to remove the exposed portions of the tunnel oxide layer 68 and HV HTO oxide layer 62 in the outer regions, as shown in FIG. 3N. Parallel removal of oxide from the logic device areas is performed during this same oxide etch.

Figure 3O:
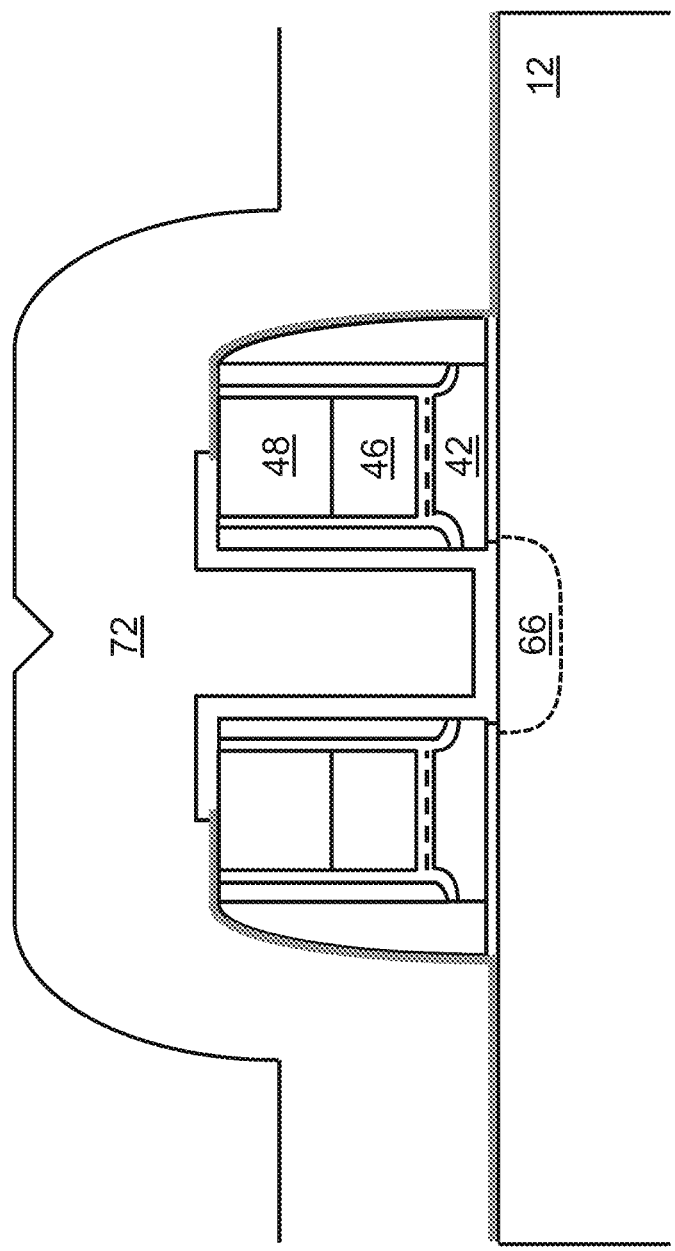
Figure 3Q:
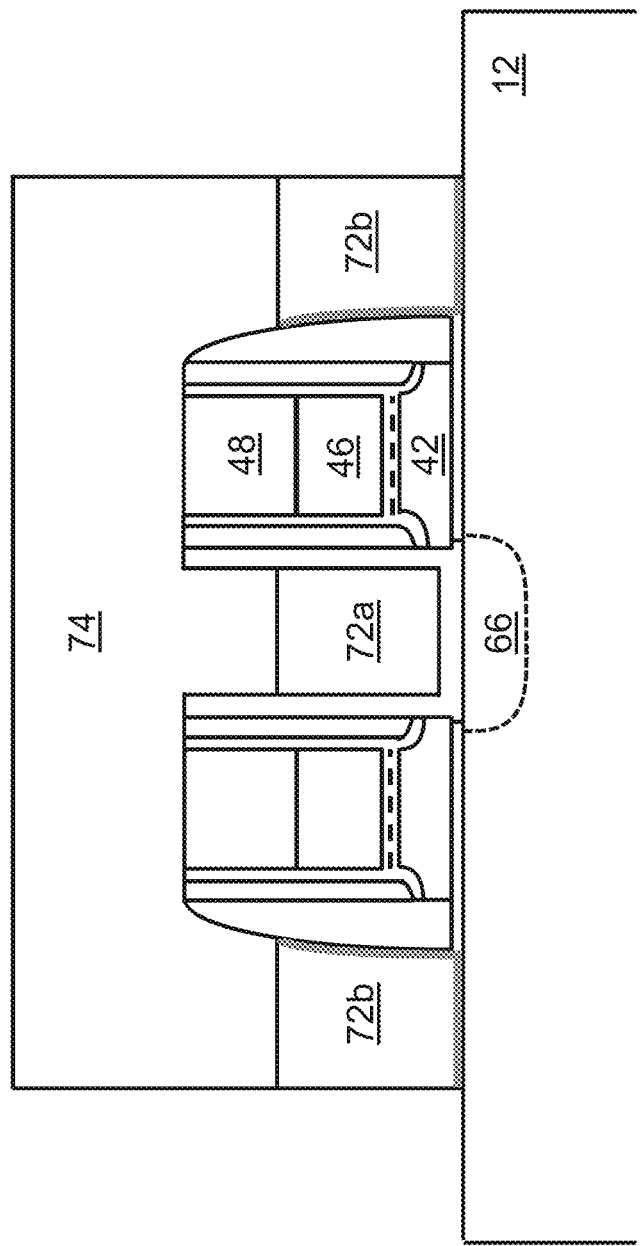
Figure 3R:
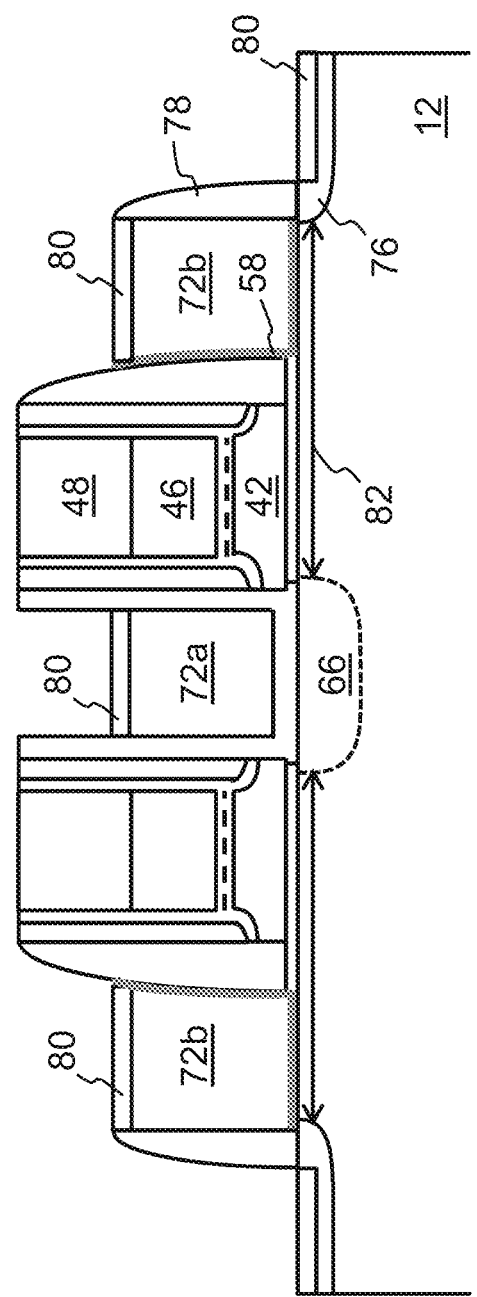

After the photo resist 70 is removed, a thick layer of polysilicon 72 is deposited over the structure (including over the structure in the logic device areas), as shown in FIG. 3O. The initial poly thickness in the memory cell area is the same as that of the logic device areas. Dummy poly may be deposited and kept in memory cell area for subsequent poly planarization. The dummy poly in the logic device areas can later be removed by poly CMP or poly etching back. The poly layer 72 is planarized by a chemical mechanical polish (CMP), followed by a further poly etch back, leaving a poly block 72a in the inner region which will be the erase gate EG, and poly blocks 72b in the outer regions which eventually will be the word line gates WL. See FIG. 3P. Photo resist 74 is formed and patterned to cover the inner region and portions of the outer regions, leaving outer portions of the outer regions exposed. A poly etch is used to remove the exposed portions of poly layer 72, defining the outer edges of the word line gates 72b, as shown in FIG. 3Q. Parallel photolithography poly etch is also used to define logic gates.

After photo resist 74 is removed, an implantation process is used to form drain regions 76 in the outer regions aligned to the word line gates 72b. Spacers of insulation material (e.g. oxide or nitride) 78 are formed along the sides of the word line gates 72b. Silicide 80 is then formed on the exposed surface portions of the erase gate 72a, word line gates 72b and substrate (drain region portion). The final structure is shown in FIG. 3R. Source and drain regions 66/76 define a channel region 82 therebetween. The conductivity of the first portion of the channel region (underneath the floating gate 42) is controlled by the floating gate 42, and the conductivity of the second portion of the channel region (underneath the word line gate 72b) is controlled by the word line gate 72b.

The oxide 50 and nitride 52 described above and shown starting in FIG. 3D has many advantages. Oxide 50 and nitride 52 formed on the outer regions of the stack pair will be the main isolation between the control gate 46 and the yet to be formed high K metal gate layer HKMG 58. Oxide 50 and nitride 52 formed in the inner region of the stack pair will be the main isolation between the control gate 46 and the yet to formed erase gate 72a. In addition, the oxide 50 and nitride 52 protect the control gate 46 and the floating gate 42 during HKMG removal from the inner stack region (see FIG. 3I). This allows the tunnel oxide 68 to be HKMG free in the inner stack region (see FIG. 3M).

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cells of the present invention. Single layers of material could be formed as multiple layers of such or similar materials, and vice versa. The terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a pair of memory cells, comprising:
   forming a polysilicon layer over and insulated from a semiconductor substrate;
   forming a pair of spaced apart conductive control gates over and insulated from the polysilicon layer, wherein the control gates having inner side surfaces facing each other and outer side surfaces facing away from each other;
   forming a first insulation layer that extends directly along the inner and outer side surfaces of the control gates;
   forming a second insulation layer that extends directly along the first insulation layer;
   removing portions of the polysilicon layer adjacent the outer side surfaces of the control gates;
   forming first insulation spacers that extend directly along the second insulation layer and indirectly along the outer side surfaces of the control gates;
   forming second insulation spacers that extend directly along the second insulation and indirectly along the inner side surfaces of the control gates;
   forming an HKMG layer extending along the first and second insulation spacers and along portions of the substrate adjacent the outer side surfaces of the control gates, wherein the HKMG layer includes:
   a layer of high K insulation material, and
   a layer of metal material on the layer of high K insulation material;
   removing portions of the HKMG layer extending along the second insulation spacers;
   removing the second insulation spacers;
   removing a portion of the polysilicon layer adjacent the inner side surfaces of the control gates;
   forming a source region in the substrate adjacent the inner side surfaces of the control gates;
   forming a conductive erase gate over and insulated from the source region, wherein the erase gate is insulated from each of the control gates by at least the first insulation layer and the second insulation layer;

forming conductive word line gates laterally adjacent to the first insulation spacers, wherein for each of the word line gates, the HKMG layer includes a first portion disposed between the word line gate and one of the first insulation spacers and a second portion disposed between the word line gate and the substrate; and forming drain regions in the substrate each disposed adjacent to one of the word line gates.

2. The method of claim 1, wherein the first insulation layer is formed of a first insulation material, and the second insulation layer is formed of a second insulation material that is different from the first insulation material.

3. The method of claim 2, wherein the first insulation material is silicon oxide, and the second insulation material is silicon nitride.

4. The method of claim 1, further comprising:
forming silicide on upper surfaces of the erase gate and the control gates.

5. The method of claim 4, further comprising:
forming silicide on an upper surface of the semiconductor substrate at the drain regions.

6. The method of claim 1, wherein the word line gates are insulated from the substrate only by the layer of high K insulation material of the HKMG layer.

7. The method of claim 1, further comprising:
forming a block of insulation material on each of the control gates, wherein the first insulation layer extends directly along side surfaces of each of the blocks of insulation material.

8. The method of claim 1, wherein the forming of the erase gate and the word line gates includes:
forming a second polysilicon layer over the substrate and over the control gates;
removing portions of the second polysilicon layer over the control gates and over the substrate, leaving a first block of the second polysilicon layer between the control gates as the erase gate, leaving a second block of the second polysilicon layer adjacent to one of the first insulation spacers as one of the word line gates, and leaving a third block of the second polysilicon layer adjacent to another one of the first insulation spacers as another one of the word line gates.

* * * * *